(12) United States Patent
Yamanaka et al.

(10) Patent No.: US 7,369,581 B2
(45) Date of Patent: May 6, 2008

(54) LASER MODULE AND METHOD OF MANUFACTURE THEREOF

(75) Inventors: Fusao Yamanaka, Kanagawa-ken (JP); Teruhiko Kuramachi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 627 days.

(21) Appl. No.: 10/954,246

(22) Filed: Oct. 1, 2004

(65) Prior Publication Data
US 2005/0072943 A1 Apr. 7, 2005

(30) Foreign Application Priority Data
Oct. 2, 2003 (JP) ............................. 2003-344390

(51) Int. Cl.
*H01S 3/30* (2006.01)
(52) U.S. Cl. ....................................... 372/5; 372/43.01
(58) Field of Classification Search ............... 372/50.1, 372/50.11, 50.12
See application file for complete search history.

(56) References Cited

U.S. PATENT DOCUMENTS 6,404,786 B1 6/2002 Kondo et al.

2003/0214987 A1 * 11/2003 Yamanaka et al. ............ 372/43

FOREIGN PATENT DOCUMENTS

| JP | 2001-177166 A | 6/2001 |
| JP | 2001177166 | * 6/2001 |

* cited by examiner

*Primary Examiner*—Michael Dung Nguyen
(74) *Attorney, Agent, or Firm*—Sughrue Mion, PLLC

(57) ABSTRACT

A laser module includes a semiconductor laser that emits laser light within a wavelength range of 350 to 450 nm, and hermetically sealing members, in which the semiconductor is sealed. The amount of organic adhesive utilized within the volume of the sealed sealing members is 1.0 g/ml or less, thereby causing a saturation concentration of outgas components generated from the adhesive to be less than 1000 ppm following a deaerating process. At least one optical component (e.g., a collimating lens) is adhesively fixed to a fixing member (e.g., a collimating lens holder) by inserting an adhesive composition including an alicyclic epoxy compound, a compound having an oxytanyl group, and a catalytic amount of an onium salt photoreaction initiator therebetween at an adhesive thickness of 0.05 µm or greater and 5 µm or less. Thereafter, the adhesive composition is cured by an activated energy beam to fix the optical component to the fixing member.

20 Claims, 4 Drawing Sheets

LASER MODULE AND METHOD OF MANUFACTURE THEREOF

BACKGROUND OF THE INVENTION

1. Field of the Invention

The present invention relates to a laser module and a method of manufacture therefor. Particularly, the present invention relates to a laser module in which constituent parts, including a semiconductor laser that emits light within a wavelength range of 350 to 450 nm, are hermetically sealed, and a method of manufacture therefor.

2. Description of the Related Art

Conventional optical modules that irradiate or generate ultraviolet rays having wavelengths of 400 nm or less are known. These optical modules have a problem in that optical loss occurs in the optical components that constitute the optical modules, due to the ultraviolet rays irradiated or generated thereby. The optical loss is thought to occur due to water and oil within the atmosphere being decomposed by the ultraviolet rays, then accumulating on the surfaces of the optical components.

U.S. Pat. No. 6,404,786 discloses an ultraviolet ray irradiating optical system that prevents decreases in output of ultraviolet laser light. The ultraviolet ray irradiating optical system seals optical components within an atmosphere comprising nitrogen at a purity of 99.9% or greater, dried air at a purity of 99.9% or greater, a gas containing water at 0.1% or less, or a gas containing hydrocarbons at 0.1% or less. Thereby, the accumulation of decomposed matter on the optical components, and therefore, decreases in output of ultraviolet light, is prevented.

The present inventors have analyzed the sealed atmospheres of modules that include semiconductor lasers that emit light within a wavelength range of 350 to 450 nm. As a result, it has been found that various compounds are included in the sealed atmospheres, as will be described below. In addition, it has been found that specific organic gas components, generated by solid organic matter which is attached to optical components and mechanical components employed in the modules, are the main causes of deterioration in laser properties.

In conventional laser modules, organic adhesives, such as that disclosed in Japanese Unexamined Patent Publication No. 2001-177166 and epoxy based adhesives such as NOA61 by Noland Co. are employed to fix laser elements and optical systems. Solid organic matter, which is attached to the optical and mechanical components within the modules are introduced from the module production atmosphere. Therefore, organic residue is present, even if cleansing is performed. Organic gas is generated from these solid organic materials, and a certain amount of the gas (so-called "outgas") fills the interior of the sealed module. Further, there are cases in which the outgas contains compounds that include silicon atoms, phosphor atoms, sulfur atoms and the like, depending on the type of organic matter.

Solvents such as isopropyl alcohol (molecular weight: 60.10, boiling point: 82.4° C.) and acetone (molecular weight: 58.08, boiling point: 56.1 to 56.5° C.) are utilized to cleanse parts that constitute the interior of the modules in the sealing step. Organic gas components having low molecular weights and low boiling points are generated by the solvents, and introduced as impurities into the sealing gas, such as dried nitrogen and dried air.

For this reason, organic gas components (hereinafter referred to as "outgas components"), which are generated from the solid organic materials, and organic gas components (hereinafter referred to as "impurity components"), which are introduced during the sealing step, are both present within the sealed atmosphere. As a result of analysis by gas chromatography, illustrated in FIG. 5 and FIG. 6, it can be seen that the distributions of molecular weights and boiling points clearly differ between the two types of components.

Figure 5:
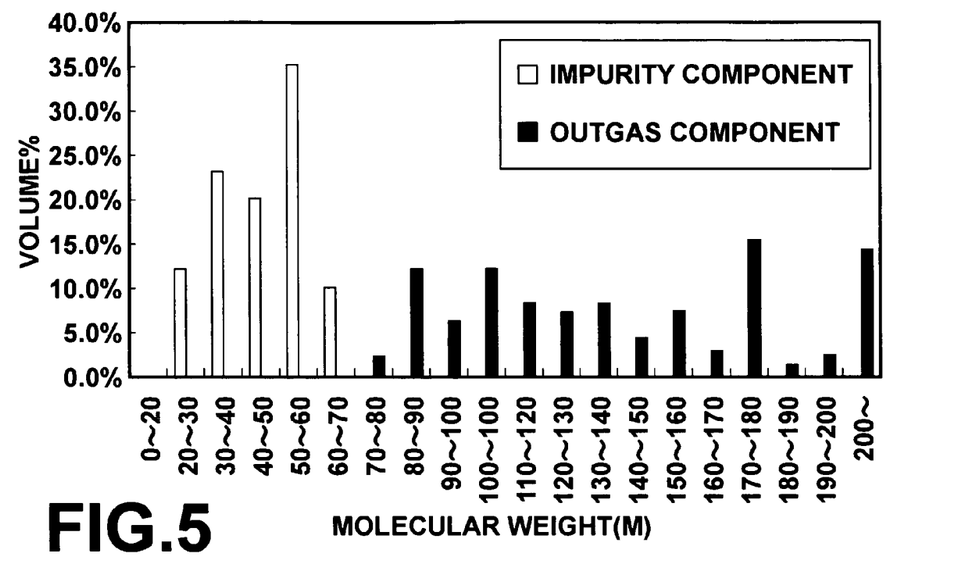
FIG. 5 is a graph that illustrates molecular weight distributions of impurity components and outgas components.
Figure 6:
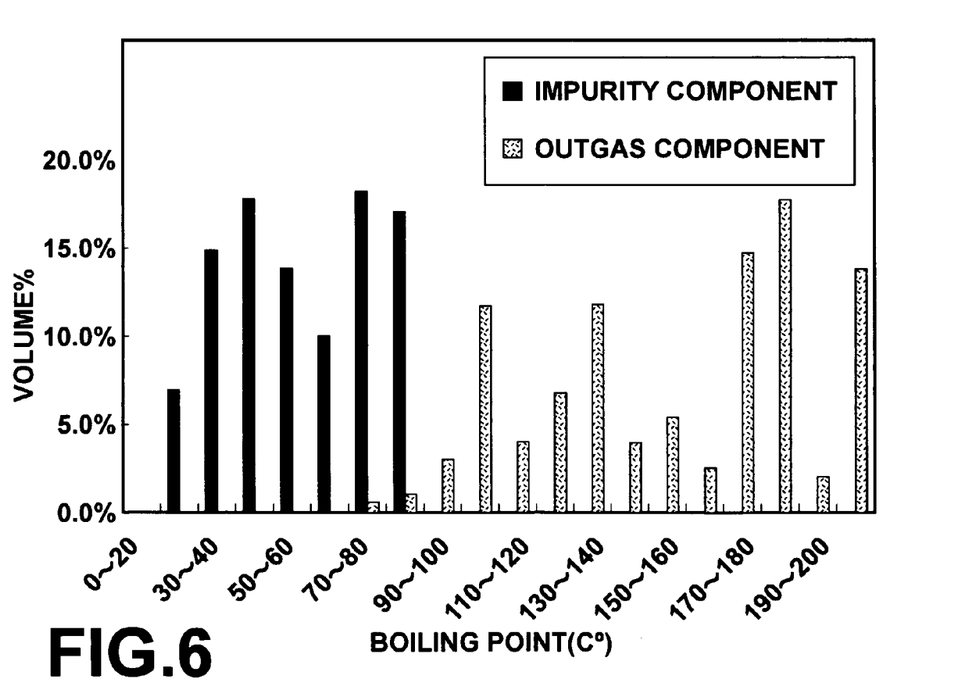
FIG. 6 is a graph that illustrates boiling point distributions of the impurity components and the outgas components.

FIG. 5 is a graph, in which the volumes of the impurity components and the outgas components are plotted against the molecular weights thereof. The total amount of each of the components, as detected by a GC-MASS (Gas Chromatography/Mass Spectrometer), is designated as 100% in the graph of FIG. 5. FIG. 6 is a graph, in which the volumes of the impurity components and the outgas components are plotted against the boiling points thereof. The total amount of each of the components, as detected by a GC-MASS, is designated as 100% in the graph of FIG. 6 as well.

That is, the molecular weights of the outgas components are distributed within a range greater than or equal to 70, whereas the molecular weights of the impurity components are distributed within a range less than 70. In addition, the boiling points of the outgas components are distributed within a range greater than or equal to 70° C., whereas the boiling points of the impurity components are distributed within a range less than 100° C.

Figure 7:
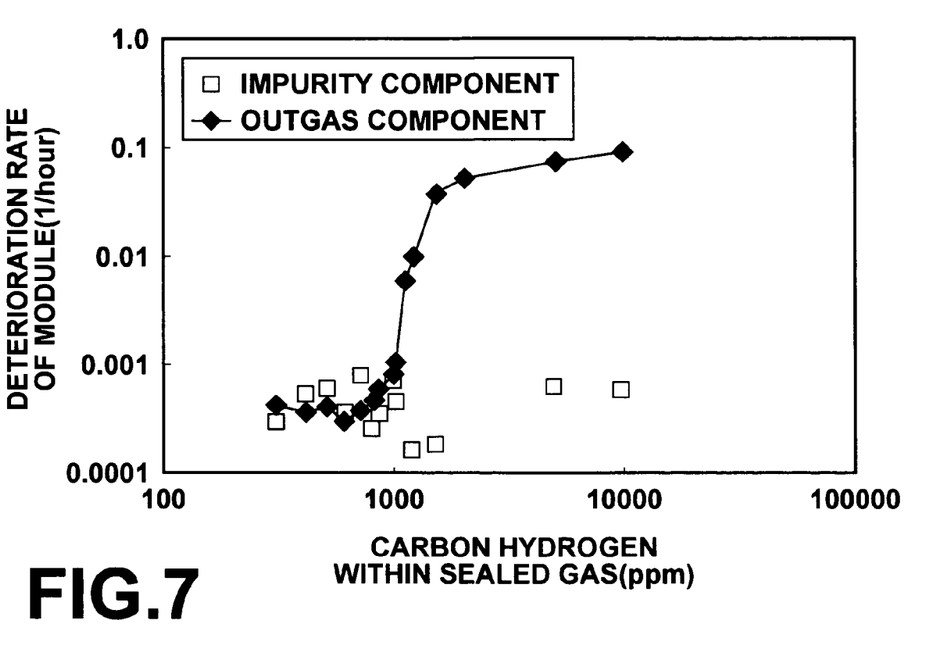
FIG. 7 is a graph that illustrates the relationships between the concentration of the impurity components and the outgas components in a sealed atmosphere and the deterioration rates of laser modules.

Next, the relationships between the concentration of the two types of organic gases in the sealed atmosphere and the deterioration rates of laser modules were investigated. Note that the laser module employed in the investigation is of the same construction as those which are to be described later, with reference to FIG. 1 through FIG. 4, except for the fact that organic adhesives were utilized therein. The results of the investigation are illustrated in FIG. 7. The deterioration rates are indicated by the amount of increased drive current necessary per hour to drive all elements of the laser modules in the case that each light emitting point thereof are driven at 100 mW.

In the graph of FIG. 7, plotted points ◆ indicate the relationship between the concentration of outgas components and the deterioration rate of the module. Plotted points ☐ indicate the relationship between the concentration of impurity components and the deterioration rate of the module. The concentrations of the impurity components were adjusted by artificially manipulating the concentration of acetone within the sealed atmosphere.

As can be seen from FIG. 7, the rate of increase in drive current rises drastically when the concentration of the outgas components becomes 1000 ppm or greater, conspicuously accelerating deterioration of the module. The cause of the accelerated deterioration is assumed to be the accumulation of solid matter, generated by photolysis of the outgas components, on light emitting portions and optical components within the module.

On the other hand, no accumulation of solid matter on the light emitting portions or the optical components within the module is observed, even when the concentration of the impurity components becomes 1000 ppm or greater. This is because the impurity components do not solidify at room temperature even if they are photolyzed. Note that even if the impurity component is changed from acetone to isopropyl alcohol, no accumulation of solid matter is observed.

SUMMARY OF THE INVENTION

The present invention has been developed in view of the foregoing circumstances. It is an object of the present invention to provide a highly reliable laser module, in which deterioration of laser characteristics is effectively suppressed. It is another object of the present invention to provide a method of manufacturing such a laser module.

The first laser module according to the present invention comprises:

a semiconductor laser that emits laser light within a wavelength range of 350 to 450 nm;

a sealing member, the interior of which is a sealed space filled with an atmosphere in which an organic gas component generated by a solid organic material is at a concentration of less than 1000 ppm, for sealing the semiconductor laser within the sealed atmosphere therein;

at least one optical component within the sealing member; and a fixing member for fixing the at least one optical component; wherein an adhesive composition that includes an alicyclic epoxy compound having an epoxy group, a compound having an oxytanyl group, and a catalytic amount of an onium salt photoreaction initiator is inserted between the at least one optical component and the fixing member, then cured with an activated energy beam to fix the optical component to the fixing member.

The second laser module according to the present invention comprises:

a multiplex laser constituted by a plurality of semiconductor lasers that emit laser light within a wavelength range of 350 to 450 nm, a single optical fiber, and a collecting optical system for collecting laser beams emitted by each of the plurality of semiconductor lasers to be incident on an end of the single optical fiber;

a sealing member, the interior of which is a sealed space filled with an atmosphere in which an organic gas component generated by a solid organic material is at a concentration of less than 1000 ppm, for sealing the semiconductor lasers, the incident end of the optical fiber, and the collecting optical system within the sealed atmosphere therein;

at least one optical component within the sealing member; and a fixing member for fixing the at least one optical component; wherein an adhesive composition that includes an alicyclic epoxy compound having an epoxy group, a compound having an oxytanyl group, and a catalytic amount of an onium salt photoreaction initiator is inserted between the at least one optical component and the fixing member, then cured with an activated energy beam to fix the optical component to the fixing member.

Note that in the first and second laser modules of the present invention, it is desirable that the adhesive composition is inserted between the optical component and the fixing member at a adhesive thickness of 0.05 μm or greater and 5 μm or less. In addition, it is desirable that the amount of solid organic material included within the sealing member prior to sealing is 1 g/ml or less of the total volume within the sealing member.

The organic gas component generated by the solid organic material may have a molecular weight of 70 or greater, or a boiling point of 70° C. or greater. The organic gas component generated by the solid organic material may also include a compound that includes at least one of a silicon atom, a phosphor atom, and a sulfur atom.

It is preferable that the sealed atmosphere is an inert gas that includes oxygen at a concentration of 1 ppm or greater and 100 ppm or less.

Meanwhile, it is desirable that the adhesive composition includes a silane coupling agent.

It is also desirable that the adhesive composition includes spherical silica particles having average diameters of 0.1 μm or greater and 1.0 μm or less.

It is desirable that the fixing member is a metallic member, and the optical component is an inorganic transparent member.

It is preferable that the compound having the oxytanyl group is represented by the general chemical formula (1) below:

wherein R1 represents a methyl group or an ethyl group, and R2 represents a hydrocarbon group having a carbon number of 6 to 12.

The method for manufacturing a laser module according to the present invention comprises the steps of:

housing a semiconductor laser that emits laser light within a wavelength range of 350 to 450 nm within the interior of a sealing member;

limiting the amount of a solid organic material within the interior of the sealing member to 1 g/ml or less of the total volume within the sealing member;

housing at least one optical component and a fixing member for fixing the at least one optical component within the sealing member;

fixing the at least one optical component to the fixing member, by inserting an adhesive composition that includes an alicyclic epoxy compound having an epoxy group, a compound having an oxytanyl group, and a catalytic amount of an onium salt photoreaction initiator between the at least one optical component and the fixing member, then curing the adhesive composition with an activated energy beam;

deaerating the interior of the sealing member until the concentration of an organic gas component generated by the solid organic material becomes less than 1000 ppm; and hermetically sealing the semiconductor laser within the interior of the sealing member following the deaerating step.

Note that in the method for manufacturing a laser module according to the present invention, it is desirable that the adhesive composition is inserted between the optical component and the fixing member at a adhesive thickness of 0.05 μm or greater and 5 μm or less.

It is also desirable that the adhesive composition has a viscosity of greater than or equal to 10 mPa·s and less than or equal to 1000 mPa·s at room temperature; and a contact angle formed by the adhesive composition with the adherend is 40 degrees or less. Further, as the adhesive composition, those that include silane coupling agents, or those that include spherical silica particles having average diameters of 0.1 μm or greater and 1.0 μm or less may be favorably employed.

In the method for manufacturing a laser module according to the present invention as well, a compound represented by the aforementioned general formula (1) may be favorably employed as the compound that has an oxytanyl group.

Note that the adhesive composition to be employed in the present invention is described in detail in Japanese Unexamined Patent Publication No. 2001-177166. A detailed description will also be given hereinafter.

The adhesive composition includes an alicyclic epoxy compound having an epoxy group, a compound having an oxytanyl group, and a catalytic amount of an onium salt photoreaction initiator as necessary components. Each of the compounds and the initiator may be a single type of compound or initiator, or a mixture of a plurality of types of compounds or initiators.

Epoxy compounds having two or more epoxy groups within a single molecule may be utilized in the present invention. Alicyclic epoxy compounds having two or more epoxy groups within a single molecule are more preferable than glycidyl compounds having two or more epoxy groups within a single molecule but not having an alicyclic structure. The "alicyclic epoxy compound having an epoxy group" refers to compounds, in which double bonds of a cycloalkene ring, such as a cyclohexane group, are epoxidated by an oxidant, such as hydrogen peroxide and a peracid. Compounds having two or more cyclohexane oxide groups, or two or more cyclopentene oxide groups within a single molecule are preferable as the alicyclic epoxy compound having an epoxy group to be employed in the present invention. As specific examples of such alicyclic epoxy compounds, there are: 4-vinyl cyclohexane dioxide; (3,4-epoxy cyclohexyl) methyl-3; 4-epoxy cyclohexyl carboxylate; di(3,4-epoxy cyclohexyl)adipate; di(3,4-epoxy cyclomethyl)adipate; bis(2,3-epoxycyclopentyl)ether; di(2, 3 epoxy-6-methyl cyclohexyl methyl)adipate; and dicyclopentadiene dioxide. A single type of alicyclic epoxy compound having an epoxy group, or a mixture of a plurality of types of alicyclic epoxy compounds having epoxy groups may be utilized. Various alicyclic epoxy compounds are commercially available from Union Carbide Japan, Daicel Chemical Industries, Ltd., and the like.

Glycidyl compounds having two or more epoxy groups within a single molecule but not having an alicyclic structure may be used in combination with the alicyclic epoxy compounds, at approximately the same amount by weight or less. The glycidyl compounds include glycidyl ether compounds, glycidyl ester compounds and the like. It is preferable that glycidyl ether compounds are used in combination with the alicyclic epoxy compounds. Specific examples of the glycidyl ether compounds are aromatic glycidyl ether compounds, such as: 1,3-bis(2,3-epoxy propyloxy)benzene; bisphenol A type epoxy resin; bisphenol F type epoxy resin; phenol novolak type epoxy resin; cresol novolak type epoxy resin; and trisphenol methane type epoxy resin; as well as aliphatic glycidyl ether compounds, such as: 1,4-butane diol glycidyl ether; and trimethylol propane triglycidyl ether. A glycidyl ester of linolenic acid dimer is an example of a glycidyl ester. A single type of glycidyl compound, or a mixture of a plurality of types of glycidyl compounds may be utilized in combination with the alicyclic epoxy compound. Various glycidyl ether compounds are commercially available from Japan Epoxy Resin and the like.

The compound having an oxytanyl group (hereinafter, also referred to simply as "oxytane compound") is a compound that has at least one oxytanyl group within a single molecule. Oxytane compounds are generally grouped into those that have one oxytanyl group within a single molecule, and those that have two or more oxytanyl groups within a single molecule.

It is preferable that a monofunctional oxytane compound be that which is represented by the following general chemical formula (1).

(1)

In general chemical formula (1), R1 represents a methyl group or an ethyl group, and R2 represents a hydrocarbon group having a carbon number of 6 to 12. Phenyl groups and benzyl groups are employable as the hydrocarbon group R2. However, alkyl groups having a carbon number of 6 to 8 are preferable, and branching alkyl groups, such as a 2-ethyl hexyl group, are particularly preferable. An example of an oxytane compound having a phenyl group as the hydrocarbon group R2 is described in Japanese Unexamined Patent Publication No. 11 (1999)-140279. An example of an oxytane compound, in which the R2 group is replaced by a benzyl group, is described in Japanese Unexamined Patent Publication No. 6 (1994)-16804. Oxytane compounds, in which R1 is an ethyl group and R2 is a 2-ethyl hexyl group, are preferably utilized in the present invention, due to their superior properties as a dilutant, a hardening accelerator, a flexibility imparting agent; and a surface tension reducing agent.

A multifunctional oxytane compound having two or more oxytanyl groups within a single molecule may also be utilized in the present invention. Preferably, the multifunctional oxytane compound is that which is represented by the following general chemical formula (2).

(2)

In general chemical formula (2), m represents a natural number 2, 3, or 4. Z represents an oxygen atom, a sulfur atom, or a selenium atom. R3 represents a hydrogen atom, a straight chain alkyl group having a carbon number of 1 to 6, a branched alkyl group having a carbon number of 1 to 6, a fluoro alkyl having a carbon number of 1 to 6, an allyl group, a phenyl group, or a furyl group. R4 is a connecting group of the value of m. It is preferable that R4 is a group that has a carbon number of 1 to 20. R4 may include one or more oxygen atoms, or one or more sulfur atoms. Z is preferably an oxygen atom, R3 is preferably an ethyl group, m is preferably 2, and R4 is preferably a linear or a branched alkylene group having a carbon number of 1 to 16 or a linear or branched poly(alkyleneoxy) group. Compounds, in which two or more of the preferred examples of R3, R4, Z, and m are combined, are particularly preferable.

The onium salt photoreaction initiator employed in the present invention refers to an onium salt that generates activated chemical species when an activated energy beam is irradiated on the adhesive composition. Aromatic iodonium salts and aromatic sulfonium salts are preferable, due to their thermal stability. Here, the activated energy beam is that which generates chemically active species (cations, such as Lewis acid and Brønsted acid) that initiate chemical reactions when the onium salt is irradiated thereby. Specific examples of the activated energy beam are: ultraviolet rays, an electron beam, gamma rays, and X rays. Ultraviolet rays are preferably employed as the activated energy beam.

In the case that aromatic sulfonium salts or aromatic iodonium salts are utilized as the onium salt photoreaction initiator, $BF_4^-$, $AsF_6^-$, $SbF_6^-$, $PF_6^-$, $B(C_6F_5)_4^-$, and the like may be employed as counter anions thereof. $PF_6$ salt and $SbF_6$ salt, which are aromatic sulfonium salts, are preferably utilized due to their solubility and polymerization activities. In order to improve solubility, it is preferable that the onium salt photoreaction initiator is of a chemical structure, in which an alkyl group or an alkoxy group having a carbon number of 1 to 10 is introduced into the aromatic group of the aromatic iodonium salts or aromatic sulfonium salts, which is usually a phenyl group. $PF_6$ salt and $SbF_6$ salt, which are aromatic sulfonium salts, are commercially available from Union Carbide Japan, and the like. $PF_6$ salt is also commercially available from Asahi Denka Co., Ltd., under the product name Adeka Optomer SP. Aromatic sulfonium salts absorb light having wavelengths up to approximately 360 nm, and aromatic iodonium salts absorb light having wavelengths up to approximately 320 nm. Therefore, it is preferable that curing is performed by irradiating ultraviolet rays including spectral energy in these wavelength ranges.

Of the chemical structure formulas shown below, sulfonium salts PI-3 and PI-4 exhibit efficient light absorbency. Therefore, these sulfonium salts are preferably utilized.

The onium salt photoreaction initiator employed in the present invention generates activated cation species by the operation of the activated energy beam. The activated cations cause cation polymerization of the alicyclic epoxy compound and the compound having the oxytanyl group, thereby curing the adhesive composition of the present invention.

The ratio by weight of the alicyclic epoxy compound with respect to the oxytane compound in the adhesive composition of the present invention is 95 to 65:5 to 35. Preferably, the ratio is 80 to 70:20 to 30. In case that the amount of a monofunctional oxytane compound is too small, the liquid properties, such as viscosity and surface tension, of the adhesive composition is not favorable. In contrast, in the case that the amount of the monofunctional oxytane compound is too great, the cured product becomes too soft, reducing the adhesive strength. Regarding the onium salt photoreaction initiator, a catalytic amount is sufficient. The amount of the onium salt photoreaction initiator to be added is 0.3 to 10 parts by weight, with respect to 100 parts by weight of the alicyclic epoxy compound and the oxytane compound combined. The preferable range of the amount of the onium salt photoreaction initiator to be added is 0.5 to 5 parts by weight.

In the present invention, the adhesive composition is inserted between the optical component and the fixing member at an adhesive thickness of 0.05 μm or greater and 5 μm or less. At adhesive thicknesses less than 0.05 μm, adhesive strength is insufficient, and at adhesive thicknesses greater than 5 μm, adverse effects due to contraction during curing are likely to occur. Adhesive thicknesses within a range from 0.05 μm to 2 μm are preferable, and a range from 0.2 μm to 1 μm is particularly preferable.

In the present invention, it is preferable to add a silane coupling agent to the adhesive composition. It is considered that the silane coupling agent acts to chemically link the adhesive composition with the optical component, and the inorganic and metallic members, to which the optical component is adhesively attached. Adhesive strength and adhesive durability may be improved by using the silane coupling agent in combination with the adhesive composition. Epoxy silanes having an epoxy group and a trimethoxysilyl group within a single molecule are preferably employed as the silane coupling agent. These types of coupling agents are commercially available from Shin-Etsu Chemical Co., Ltd., under the product names KBM303, KBM403, KBE402, and the like. The preferred amount of the silane coupling agent to be utilized is in a range from 0.5 to 5 parts by weight with respect to 100 parts by weight of the alicyclic epoxy compound and the oxytane compound combined. A range from 1 to 3 parts by weight is further preferable.

In the present invention, it is preferable that spherical silica particles be included in the adhesive composition as well. It is preferable that the spherical silica particles have average diameters of 0.1 μm or greater and 2.0 μm or less, and that the spherical distribution is as uniform as possible. Spherical silica particles having average grain sizes of 0.2 μm or greater and 0.8 μm or less are preferably utilized in the present invention. Silica particles having shapes close to true spheres and having few ionic impurities are particularly preferable. The thermal durability of the cured adhesive compound is improved by adding the silica particles. The preferred amount of the spherical silica particles to be added may be selected from within a range from 1 to 20 parts by weight with respect to 100 parts by weight of the adhesive composition. Synthetic quartz spherical silica is commercially available from Tatsumori Co., Ltd.

The adhesive composition of the present invention is favorably utilized to adhesively attach inorganic transparent members, such as lenses and mirrors, to metallic fixing members, such as holders made of copper, copper alloys, and aluminum.

The inventors have discovered, as the result of committed study, that favorable adhesive fixation can be obtained by: adjusting the viscosity of the adhesive composition to 10 mPa·s or greater and 1000 mPa·s or less at room temperature (25° C.); and by adjusting the contact angle formed by the adhesive composition with the adherend to be 40 degrees or less. Further favorable adhesive fixation can be obtained by:

adjusting the viscosity of the adhesive composition to 80 mPa·s or greater and 300 mPa·s or less at room temperature (25° C.); and by adjusting the contact angle formed by the adhesive composition with the adherend to be 30 degrees or less. Adding monofunctional oxytane compounds is effective in the adjustment of the composition viscosity. The contact angle can be adjusted by adding a fluorine surfactant. The fluorine surfactant is a surfactant which has a fluorinated carbon as a hydrophobic group. There are three types of fluorine surfactants, the three types being anion, cation, and nonion types. In the present invention, it is preferable to utilize a fluorinated alkyl ester nonionic surfactant. The amount of the nonionic surfactant to be added is within a range from 0.1 to 1 part by weight with respect to 100 parts by weight of the adhesive composition. Nonionic surfactants are commercially available from Sumitomo 3M, under the product names Fluorad FC170C, Fluorad 171, Fluorad 430, Fluorad 431, and the like.

Inactive components, such as coating compounds and colorants, may be added to the adhesive composition in addition to the additives described above. Photosensitizing agents, such as pyrene, perylene, acridine orange, thioxantone, 2-chloro thioxantone, and benzo pyran may be added to improve photo curing properties. Various light sources may be utilized as the ultraviolet irradiation source for ultraviolet curing. Examples of such light sources are: mercury arc lamps, xenon arc lamps, carbon arc lamps, and tungsten halogen copying lamps.

According to the first laser module of the present invention, a semiconductor laser that emits laser light within a wavelength range of 350 to 450 nm is provided within a sealed atmosphere, in which the concentration of organic gas components (outgas components), generated by solid organic matter, is less than 1000 ppm. Therefore, the generation of accumulative matter due to reaction of the organic gas components with the laser light is reduced, effectively suppressing the deterioration of laser properties. Thereby, the first laser module according to the present invention is made reliable.

According to the second laser module of the present invention, a plurality of semiconductor lasers that emit laser light within a wavelength range of 350 to 450 nm, an incident end of an optical fiber, and a collecting optical system are provided within a sealed atmosphere, in which the concentration of organic gas components (outgas components), generated by solid organic matter, is less than 1000 ppm. In this case as well, the generation of accumulative matter due to reaction of the organic gas components with the laser light is reduced, effectively suppressing the deterioration of laser properties. Thereby, the second laser module according to the present invention is made reliable.

A configuration may be adopted wherein the amount of solid organic material included within the sealing member prior to sealing is 1 g/ml or less of the total volume within the sealing member. In this case, it is possible to cause the concentration of organic gas components generated by the solid organic material within the sealed atmosphere to be less than 1000 ppm, by deaerating the sealing member prior to sealing. Here, organic material refers to organic matter included in an organic adhesive or the like, which is solid at room temperature.

Note that the organic gas components generated by the solid organic material is decomposed by laser light, and the decomposed matter accumulates on the optical components and the like. However, in the case that the sealed atmosphere is an inert gas that includes oxygen at a concentration of 1 ppm or greater and 100 ppm or less, the decomposed accumulative matter undergoes oxidative decomposition, further suppressing the deterioration of laser properties.

In the present invention, if the aforementioned adhesive composition is utilized to adhesively attach the optical component and the fixing member, the rate of contraction during curing (linear contraction rate) can be suppressed to about 2%. Therefore, if the layer thickness of the adhesive composition is 5 µm or less in the case that optical components that constitute the laser module, such as a semiconductor laser element, a collimating lens, a condensing lens, and an optical fiber, are fixed to the fixing member, the contraction can be suppressed to 5×0.02=0.01 µm, which is extremely small, even if contraction progresses in uncured portions of the adhesive composition. Further, the aforementioned adhesive composition is capable of being cured to realize strong adhesion while maintaining flexibility, even if the space between the optical components and the fixing member is as narrow as about 1 µm, over a wide temperature range from −25° C. to 70° C. Thereby, the accuracy in relative positions of the optical components is maintained at a high level, which also renders the laser modules of the present invention highly reliable.

In the method for manufacturing a laser module of the present invention, a configuration may be adopted wherein the adhesive composition has a viscosity of greater than or equal to 10 mPa·s and less than or equal to 1000 mPa·s at room temperature; and a contact angle formed by the adhesive composition with the adherend is 40 degrees or less. In this case, particularly favorable adhesive fixation can be realized, as described previously.

DESCRIPTION OF THE PREFERRED EMBODIMENTS

Hereinafter, an embodiment of the present invention will be described in detail with reference to the drawings.

[Structure of Module]

Figure 1:
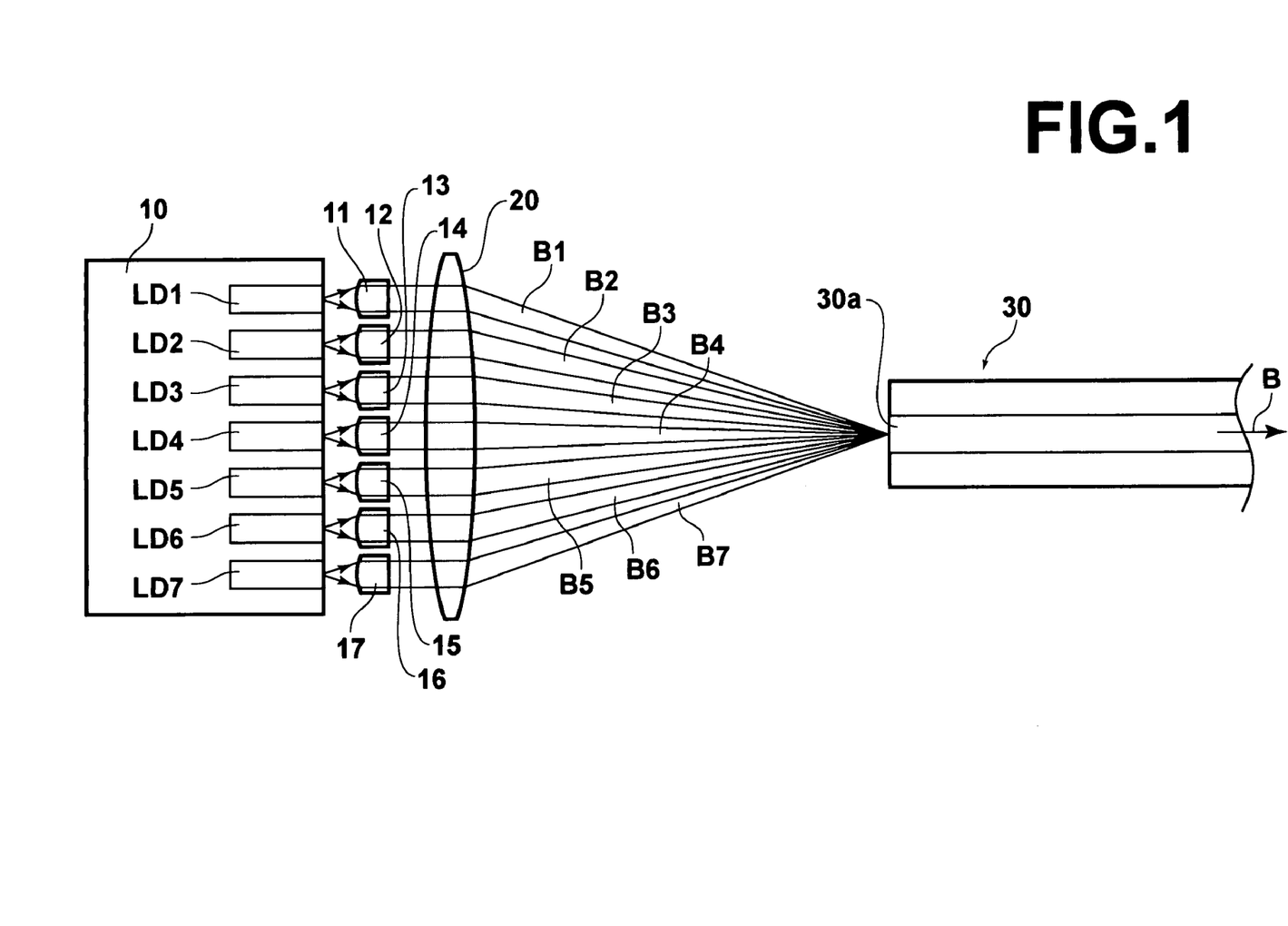
FIG. 1 is a schematic diagram illustrating the main parts of a laser module according to a first embodiment of the present invention.

A laser module according to the present embodiment is equipped with a multiplex laser light source, as illustrated in FIG. 1. The multiplex laser light source comprises a plurality (seven, for example) of transverse multimode chip GaN semiconductor lasers LD1, LD2, LD3, LD4, LD5, LD6, and LD7, which are aligned and fixed on a heat block 10; collimating lenses 11, 12, 13, 14, 15, 16, and 17, corresponding to each of the GaN semiconductor lasers LD1 through LD7; a condensing lens 20; and a multimode optical fiber 30.

All of the GaN semiconductor lasers LD1 through LD7 have the same oscillating wavelength (405 nm, for example), and the same maximum output (100 mW, for example). Note that lasers that emit laser light at oscillating wavelengths within a range from 350 to 450 nm, other than 405 nm, may be employed as the GaN semiconductor lasers LD1 through LD7.

Figure 2:
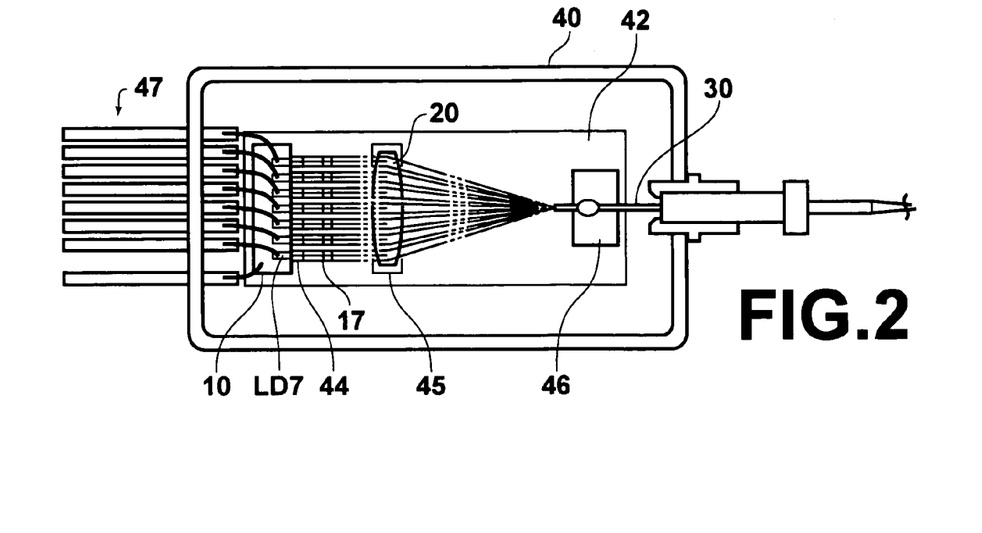
FIG. 2 is a plan view of the laser module of FIG. 1.
Figure 3:
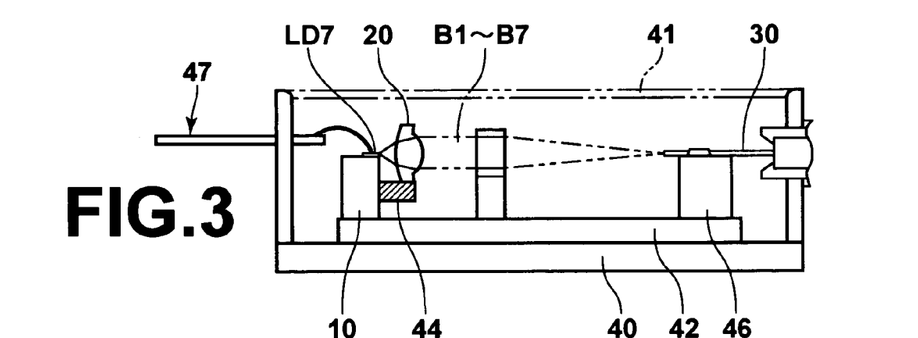
FIG. 3 is a side view of the laser module of FIG. 1.

The multiplex laser light source is housed within a box shaped package 40 having an open top, along with other optical elements, as illustrated in FIG. 2 and FIG. 3. A base plate 42 is fixed on the bottom surface of the package 40. The heat block 10, a condensing lens holder 45 for holding the condensing lens 20, and a fiber holder 46 for holding an incident end of the multimode optical fiber 30 are mounted on the upper surface of the base plate 42. A collimating lens holder 44 is mounted on the side surface of the hear block 10, and the collimating lenses 11 through 17 are held thereby. Openings are formed in a side wall of the package 40, through which circuits 47 that supply drive current to the GaN semiconductor lasers LD1 through LD7 are drawn out of the package 40.

Note that in FIG. 2, only the GaN semiconductor laser LD7, from among the plurality of GaN semiconductor lasers, is denoted by a reference numeral, and that only the collimating lens 17, from among the plurality of collimating lenses, is denoted by a reference numeral, in order to avoid complication of the drawing.

Figure 4:
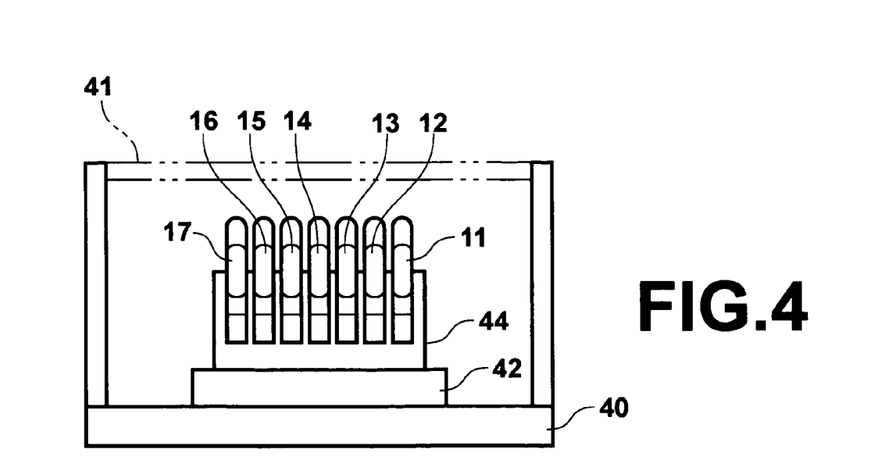
FIG. 4 is a partial elevational view of the laser module of FIG. 1.

FIG. 4 is a front view of the mounting portion of the collimating lenses 11 through 17. Each of the collimating lenses 11 through 17 is formed as elongate sections of circular lenses that have aspherical surfaces, cut along parallel planes, such that the optical axes of the circular lenses are included within the cutout portions. The elongate collimating lenses may be formed by molding resin or optical glass, for example. The collimating lenses 11 through 17 are provided such that their lengthwise directions are perpendicular with the arrangement direction of the light emitting points of the GaN semiconductor lasers LD1 through LD7 (the horizontal direction in FIG. 4).

Meanwhile, lasers, which have active layers with light emitting widths of 2 μm, and which emit laser beams B1 through B7 with spread angles of 10° and 30° in the direction parallel to the active layer and the direction perpendicular to the active layer, respectively, are employed as the GaN semiconductor lasers LD1 through LD7. The GaN semiconductor lasers LD1 through LD7 are provided so that light emitting points thereof are aligned in a direction parallel to the active layers.

Accordingly, the laser beams B1 through B7, emitted from each of the light emitting points, enter each of the aforementioned elongate collimating lenses 11 through 17 such that the direction in which the spread angle is great matches the lengthwise directions thereof, and such that the direction in which the spread angle is small matches the widthwise directions (direction perpendicular to the lengthwise direction) thereof. That is, the widths of each of the collimating lenses 11 through 17 are 1.1 mm, and the lengths thereof are 4.6 mm. The beam diameters of the laser beams B1 through B7, which enter the collimating lenses 11 through 17, are 0.9 mm in the horizontal direction, and 2.6 mm in the vertical direction. In addition, each of the collimating lenses 11 through 17 have focal distances $f_1=3$ mm, and numerical apertures NA=0.6. The collimating lenses 11 through 17 are provided with an arrangement pitch of 1.25 mm.

The condensing lens 20 is formed as an elongate section of a circular lens that has an aspherical surface, which is long in the arrangement direction of the collimating lenses 11 through 17, that is, the horizontal direction, and short in the direction perpendicular thereto. The condensing lens 20 has a focal distance $f_2=12.5$ mm, and a numerical aperture NA=0.3. The condensing lens 20 may also be formed by molding resin or optical glass.

The multimode optical fiber 30 may be a step index optical fiber, a graded index optical fiber, or a compound type optical fiber. A graded index optical fiber manufactured by Mitsubishi Cable Industries, Ltd. may be favorably employed, for example. This optical fiber is of the graded index type at the central core, and of the step index type at its peripheral portion. The core diameter is 25 μm, the numerical aperture is NA=0.3, and the transmissivity of the end facet coating is 99.5% or greater.

The package 40 is equipped with a package lid 41 for closing the opening thereof. The opening of the package 40 is closed with the package lid 41 following a deaerating process, to be described later, and after sealing gas is introduced into the package 40. Thereby, the multiplex laser light source is hermetically sealed within the closed space (sealed space) formed by the package 40 and the package lid 41, along with other optical elements.

As described above, deterioration of modules is promoted when the concentration of outgas components within a sealed atmosphere is 1000 ppm or greater. Therefore, the package is hermetically sealed so that the concentration of the outgas components within the sealed atmosphere is less than 1000 ppm. To this end, fixation of the optical components is not performed using organic adhesives at all, inorganic adhesives only are used for fixation, and the amount of adhesive used is made to be 1.0 g/ml or less, for example.

A deaerating process that evacuates the atmosphere within the sealed space is performed prior to hermetically sealing the sealing gas. Even in the case that organic adhesives are employed to fix the optical system within the module, outgas generated from the organic adhesives can be suppressed, by performing the deaerating process following fixation of the optical components and prior to sealing.

Generally, the dearating process is performed at 200° C. or less, from the viewpoint of preserving the mechanical properties of the adhesive. It has been confirmed that if the module is sealed following deaeration, and the amount of outgas components included in the sealed atmosphere therein is measured, the amount of organic gas released within the module will not be at a certain level or less, the greater the amount of adhesive employed therein.

The amount of solid organic material included within the total volume of the sealed atmosphere was varied from 0.5 g/ml (g/cc) to 10 g/ml by unit volume of the solid organic matter, by introducing predetermined amounts of organic adhesive (solid organic matter) into laser modules. Thereafter, the concentrations of outgas components were measured following the deaerating process. The deaerating process was performed at 90° C., and nitrogen gas, which is 99.999% pure or greater, was hermetically sealed within the laser modules. The concentrations of outgas components within the sealed modules was measured by gas chromatography after 24 hours.

When the concentration of outgas components reaches a certain level, the amount of outgas components within the sealed atmosphere do not decrease, even if the deaerating time is increased. The reason why such saturation states are reached is because the raw material of the adhesive is decomposed during the deaerating process, remain in the adhesive, and become outgas following sealing, even if deaeration of the uncured portions of the adhesive is completed.

In the case that the amount of organic adhesive introduced into the module is 1.2 g/ml, the saturation value is high, and the concentration of outgas components within the module does not become less than 1000 ppm even if the deaerating process is performed for a long period of time. However, by introducing the organic adhesive at an amount of 1.0 g/ml or less, the saturation concentration of the outgas components within the module can become less than 1000 ppm, by the deaerating process.

Even in the case that the amount of organic adhesive introduced into the module is 1.0 g/ml or less, it is preferable that the deaerating process is performed for 130 to 200 hours, at a temperature within a range of 60 to 150° C., in order to reach the saturation concentration.

An inert gas, such as dried nitrogen gas, or dried air may be employed as the sealing gas. It is particularly preferable that an inert sealing gas including a trace amount of oxygen be employed. If trace amounts of oxygen are included within the sealed atmosphere, deterioration of the laser module can be further suppressed. This deterioration suppression effect is obtained, because the oxygen included in the sealed atmosphere decomposes and oxidizes solid matter generated by photodecomposition of the outgas components. It is preferable for the oxygen concentration within the sealed atmosphere to be 1 to 100 ppm. If the oxygen concentration is 100 ppm, accumulative matter can be sufficiently decomposed and removed, even if the outgas concentration is about 1000 ppm.

[Operation of Module]

Next, the operation of the laser module described above will be described. Each of the laser beams B1, B2, B3, B4, B5, B6, and B7, emitted in a diffused state by the GaN semiconductor lasers LD1 through LD7 that constitute the multiplex laser light source, is collimated by the collimating lenses 11 through 17 corresponding thereto. The collimated laser beams B1 through B7 are condensed by the condensing lens 20, and converge on an incident end facet of a core 30a of the multimode optical fiber 30.

In the present example, a condensing optical system is constituted by the collimating lenses 11 through 17 and the condensing lens 20. A multiplex optical system is constituted by the condensing optical system and the multimode optical fiber 30. That is, the laser beams B1 through B7, which have been condensed by the condensing lens 20, enter the core 30a of the multimode optical fiber 30, propagate through the optical fiber 30, and are emitted from the multimode optical fiber 30 as a single multiplexed laser beam B.

In the laser module described above, the coupling efficiency of the laser beams B1 through B7 with respect to the multimode optical fiber 30 is 0.9. Accordingly, in the case that the output of each of the GaN semiconductor lasers LD1 through LD7 are 100 mW, a multiplex laser beam B is obtained having an output of 630 mW (=100 mW×0.9×7).

As described above, in the laser module of the present embodiment, the amount of organic adhesive utilized within the volume of the sealed space is less than 1.0 g/ml. Therefore, the saturation concentration of outgas components generated from the adhesive can be made to be less than 1000 ppm, by performing the deaerating process. Thereby, the amount of decomposed matter, generated by the outgas components being decomposed by laser light, can be reduced, to conspicuously suppress deterioration of the module. That is, the reliability of the laser module is improved, and high output can be maintained over a long period of time. In addition, by including trace amounts of oxygen within the sealed atmosphere, deterioration of the laser module can be further suppressed.

Next, adhesion of the collimating lenses 11 through 17 to the collimating lens holder 44, which is a metallic fixing member formed of copper or the like, will be described. Adhesion surfaces (the bottom surfaces in FIG. 3) of the collimating lenses 11 through 17 were placed in contact with an adhesion surface of the collimating lens holder 44. An adhesive composition, described hereunder, was inserted in the gaps between the collimating lenses 11 through 17 and the collimating lens holder 44, then cured by irradiating ultraviolet rays thereon. UVR6128 (bis(e,4-epoxy cyclohexyl)) by Union Carbide Japan was utilized as an alicyclic epoxy compound, Aron Oxytane OXT-212 (EHOX) by Toagosei Co., Ltd. was utilized as a monofunctional oxytane compound, and UVI-6990 (PF5 salt of triallyl sulfonium) by Union Carbide Japan was utilized as a photoreaction initiator. Ratios by weight of the above components were set as illustrated in Table 1, to adjust the compositions of embodiments 1 through 3 of the adhesive composition and comparative example 1.

TABLE 1

| | Comparative Example 1 | Embodiment 1 | Embodiment 2 | Embodiment 3 |
|---|---|---|---|---|
| UVR6128 | 100 | 90 | 80 | 70 |
| EHOX | 0 | 10 | 20 | 30 |
| UVI6990 | 3 | 3 | 3 | 3 |
| Uniformity of Adhesion Surface After UV Irradiation | Poor | Fair | Good | Excellent |
| Holder Contact Angle (°) | 52 | 38 | 28 | 26 |
| Lens Contact Angle | 36 | 25 | 17 | 17 |

Adhesion uniformity was visually inspected with an optical microscope following curing of the adhesive compound with ultraviolet irradiation. As a result, it was observed that embodiments 1 through 3, which employed the oxytane compound EHOX in combination, exhibited superior uniformity of adhesion surfaces, compared to the comparative example 1, which did not employ the oxytane compound.

Next, adhesion of the collimating lenses 11 through 17 to the collimating lens holder 44, employing different adhesive compositions, will be described. Adhesion surfaces (the bottom surfaces in FIG. 3) of the collimating lenses 11 through 17 were placed in contact with an adhesion surface of the collimating lens holder 44. An adhesive composition, described hereunder, was inserted in the gaps between the collimating lenses 11 through 17 and the collimating lens holder 44, then cured by irradiating ultraviolet rays thereon. UVR6128 by Union Carbide Japan was utilized as the alicyclic epoxy compound, Epicoat 806, which is an F type bisphenol, by Japan Epoxy Resin was utilized as a bifunctional glycidyl compound, Aron Oxytane OXT-212 (EHOX) by Toagosei Co., Ltd. was utilized as necessary as the monofunctional oxytane compound, and UVI-6990 (PF5 salt of triallyl sulfonium) by Union Carbide Japan was utilized as the photoreaction initiator. In addition, KBM303 by Shin-Etsu Chemical Co., Ltd. was employed as necessary as a silane coupling agent, and 1-FX (average particle diameter=0.38 μm) by Tatsumori Co., Ltd. was employed as necessary as synthetic quartz spherical silica. Ratios by weight of the above components were set as illustrated in Table 2, to adjust the compositions of embodiments 4 through 10 of the adhesive composition.

TABLE 2

| Embodiment Number | 4 | 5 | 6 | 7 | 8 | 9 | 10 |
|---|---|---|---|---|---|---|---|
| UVR6128 | 85 | 80 | 70 | 70 | 70 | 35 | 35 |
| Epicoat 806 | 0 | 0 | 0 | 0 | 0 | 35 | 35 |
| EHOX | 15 | 20 | 30 | 30 | 30 | 30 | 30 |
| UVR6990 | 3 | 3 | 3 | 3 | 3 | 3 | 3 |
| KBM303 | 0 | 0 | 0 | 1 | 2 | 2 | 2 |
| 1-FX | 0 | 0 | 0 | 0 | 0 | 0 | 10 |
| Holder Contact Angle (°) | 33 | 28 | 26 | 23 | 19 | 20 | 21 |
| Lens Contact Angle (°) | 23 | 18 | 17 | 14 | 9 | 8 | 10 |
| Viscosity (mPa · s) | 250 | 190 | 100 | 100 | 100 | 105 | 150 |
| Adhesive Thickness (μm) | 0.4 | 0.4 | 0.4 | 0.4 | 0.3 | 0.4 | 0.4 |
| Peeling Rate after −25° C.~70° C. Preservation Test | 50% | 25% | 17% | 12% | 0% | 0% | 0% |

The occurrence of peeling was measured after the adhesive compositions were cured by ultraviolet irradiation, and after a −25° C.~70° C. preservation test was performed. The results of measurement are indicated in Table 2. Embodiments 5 and 6, which had increased amounts of the monofunctional oxytane compound EHOX, exhibited lower peeling occurrence rates than Embodiment 4. Embodiments 7 and 8, in which the silane coupling agent was further added, exhibited even lower peeling occurrence rates, and particularly, no peeling was observed in Embodiment 8. In addition, the F type bisphenol glycidyl compound was used in combination with the alicyclic epoxy compound in Embodiment 9, and synthetic quartz spherical silica was further added in Embodiment 10. Neither Embodiment 9 nor Embodiment 10 exhibited any peeling between the collimating lens holder 44 and the adhesive layer after the forced preservation test.

Layer thicknesses of the adhesives between the collimating lens holder 44 and the collimating lenses 11 through 17 were measured following curing of the above adhesive compositions with ultraviolet radiation. The measured layer thicknesses were within a range of approximately 0.3 μm to 0.6 μm. The volume contraction rate during curing of the adhesives is 4 to 5%, and changes in thicknesses of the adhesive layers following the −25° C.~70° C. preservation test were suppressed to 0.03 μm or less. Accordingly, the positional relationships between the GaN semiconductor lasers LD1 through LD7 and the collimating lenses 11 through 17, which have been adjusted for optical axis alignment, are not adversely affected by the adhesion, thereby enabling a favorable multiplexing effect.

Note that the aforementioned adhesion method may also be applied to other optical components and their fixing members within the package 40. For example, the adhesion method may be applied to adhesively attach the condensing lens 20 and the condensing lens holder 45, the multimode optical fiber 30 and the fiber holder 46, and the like. In these cases as well, the same basic effects as those described above are obtained.

Further, the aforementioned adhesion method is not limited to the laser module illustrated in FIGS. 1 through 4. The adhesion method may be applied to any laser module that comprises optical components such as a light source, lenses, mirrors, half mirrors, concave mirrors, convex mirrors, and diffraction gratings. That is, the adhesion method may be employed during adhesive fixation of the optical components to their fixing members. In these cases as well, the same basic effects as those described above are obtained.

What is claimed is:

1. A laser module comprising:
   a semiconductor laser that emits laser light within a wavelength range of 350 to 450 nm;
   a sealing member, the interior of which is a sealed space filled with an atmosphere in which an organic gas component generated by a solid organic material is at a concentration of less than 1000 ppm, for sealing the semiconductor laser within the sealed atmosphere therein;
   at least one optical component within the sealing member; and
   a fixing member for fixing the at least one optical component; wherein
   an adhesive composition that includes an alicyclic epoxy compound having an epoxy group, a compound having an oxytanyl group, and a catalytic amount of an onium salt photoreaction initiator is inserted between the at least one optical component and the fixing member, then cured with an activated energy beam to fix the optical component to the fixing member.

2. A laser module as defined in claim 1, wherein:
   the amount of solid organic material included within the sealing member prior to sealing is 1 g/ml or less of the total volume within the sealing member.

3. A laser module as defined in claim 1, wherein:
   the organic gas component generated by the solid organic material has a molecular weight of 70 or greater, or a boiling point of 70° C. or greater.

4. A laser module as defined in claim 1, wherein:
   the organic gas component generated by the solid organic material includes a compound that includes at least one of a silicon atom, a phosphor atom, and a sulfur atom.

5. A laser module as defined in claim 1, wherein:
   the sealed atmosphere is an inert gas that includes oxygen at a concentration of 1 ppm or greater and 100 ppm or less.

6. A laser module as defined in claim 1, wherein:
   the adhesive composition includes a silane coupling agent.

7. A laser module as defined in claim 1, wherein:
   the adhesive composition includes spherical silica particles having average diameters of 0.1 μm or greater and 1.0 μm or less.

8. A laser module as defined in claim 1, wherein:
   the fixing member is a metallic member, and the optical component is an inorganic transparent member.

9. A laser module as defined in claim 1, wherein:
   the compound having the oxytanyl group is represented by the general chemical formula (1) below:

(1)

wherein R1 represents a methyl group or an ethyl group, and R2 represents a hydrocarbon group having a carbon number of 6 to 12.

10. A laser module comprising:
   a multiplex laser constituted by a plurality of semiconductor lasers that emit laser light within a wavelength range of 350 to 450 nm, a single optical fiber, and a collecting optical system for collecting laser beams emitted by each of the plurality of semiconductor lasers to be incident on an end of the single optical fiber;

a sealing member, the interior of which is a sealed space filled with an atmosphere in which an organic gas component generated by a solid organic material is at a concentration of less than 1000 ppm, for sealing the semiconductor lasers, the incident end of the optical fiber, and the collecting optical system within the sealed atmosphere therein;

at least one optical component within the sealing member; and a fixing member for fixing the at least one optical component; wherein an adhesive composition that includes an alicyclic epoxy compound having an epoxy group, a compound having an oxytanyl group, and a catalytic amount of an onium salt photoreaction initiator is inserted between the at least one optical component and the fixing member, then cured with an activated energy beam to fix the optical component to the fixing member.

11. A laser module as defined in claim 10, wherein:
the amount of solid organic material included within the sealing member prior to sealing is 1 g/ml or less of the total volume within the sealing member.

12. A laser module as defined in claim 10, wherein:
the organic gas component generated by the solid organic material has a molecular weight of 70 or greater, or a boiling point of 70° C. or greater.

13. A laser module as defined in claim 10, wherein:
the organic gas component generated by the solid organic material includes a compound that includes at least one of a silicon atom, a phosphor atom, and a sulfur atom.

14. A laser module as defined in claim 10, wherein:
the sealed atmosphere is an inert gas that includes oxygen at a concentration of 1 ppm or greater and 100 ppm or less.

15. A laser module as defined in claim 10, wherein:
the adhesive composition includes a silane coupling agent.

16. A laser module as defined in claim 10, wherein:
the adhesive composition includes spherical silica particles having average diameters of 0.1 μm or greater and 1.0 μm or less.

17. A laser module as defined in claim 10, wherein:
the fixing member is a metallic member, and the optical component is an inorganic transparent member.

18. A laser module as defined in claim 10, wherein:
the compound having the oxytanyl group is represented by the general chemical formula (1) below:

wherein R1 represents a methyl group or an ethyl group, and R2 represents a hydrocarbon group having a carbon number of 6 to 12.

19. A method for manufacturing a laser module, comprising the steps of:

housing a semiconductor laser that emits laser light within a wavelength range of 350 to 450 nm within the interior of a sealing member;

limiting the amount of a solid organic material within the interior of the sealing member to 1 g/ml or less of the total volume within the sealing member;

housing at least one optical component and a fixing member for fixing the at least one optical component within the sealing member;

fixing the at least one optical component to the fixing member, by inserting an adhesive composition that includes an alicyclic epoxy compound having an epoxy group, a compound having an oxytanyl group, and a catalytic amount of an onium salt photoreaction initiator between the at least one optical component and the fixing member, then curing the adhesive composition with an activated energy beam;

deaerating the interior of the sealing member until the concentration of an organic gas component generated by the solid organic material becomes less than 1000 ppm; and hermetically sealing the semiconductor laser within the interior of the sealing member following the deaerating step.

20. A method for manufacturing a laser module as defined in claim 19, wherein:

the adhesive composition has a viscosity of greater than or equal to 10 mPa·s and less than or equal to 1000 mPa·s at room temperature; and a contact angle formed by the adhesive composition with the adherend is 40 degrees or less.

* * * * *